(12) United States Patent
Park et al.

(10) Patent No.: US 11,099,350 B2
(45) Date of Patent: *Aug. 24, 2021

(54) LENS DRIVING DEVICE, CAMERA MODULE AND OPTICAL APPARATUS

(71) Applicant: LG INNOTEK CO., LTD., Seoul (KR)

(72) Inventors: Tae Bong Park, Seoul (KR); Hee Se Lee, Seoul (KR); Jin Suk Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/683,581

(22) Filed: Nov. 14, 2019

(65) Prior Publication Data

US 2020/0081219 A1 Mar. 12, 2020

Related U.S. Application Data

(63) Continuation of application No. 15/000,613, filed on Jan. 19, 2016, now Pat. No. 10,520,699.

(30) Foreign Application Priority Data

Jan. 16, 2015 (KR) .................. 10-2015-0007754
Jan. 26, 2015 (KR) .................. 10-2015-0011858

(51) Int. Cl.
*G02B 7/08* (2021.01)
*G02B 27/64* (2006.01)
(Continued)

(52) U.S. Cl.
CPC .............. *G02B 7/08* (2013.01); *G02B 7/023* (2013.01); *G02B 7/028* (2013.01); *G02B 7/04* (2013.01);
(Continued)

(58) Field of Classification Search
CPC .......... G02B 7/023; G02B 7/028; G02B 7/04; G02B 7/09; G02B 7/10; G02B 7/102; G02B 7/105
(Continued)

(56) References Cited

U.S. PATENT DOCUMENTS 7,070,207 B2 * 7/2006 Asai .................... G02B 6/12002
257/113
7,676,123 B2 * 3/2010 Kodama ................ G02B 7/022
385/14

(Continued)

FOREIGN PATENT DOCUMENTS

CN 102879973 A 1/2013
CN 103117637 A 5/2013

(Continued)

OTHER PUBLICATIONS

European Search Report dated May 4, 2016 in European Application No. 16150980.7.

(Continued)

*Primary Examiner* — Nicholas R. Pasko
(74) *Attorney, Agent, or Firm* — Saliwanchik, Lloyd & Eisenschenk

(57) ABSTRACT

A lens driving device is provided, including: a holder member; a first driving unit disposed at the holder member; a base disposed at a lower side of the holder member and spaced apart from the holder member; a first circuit board disposed at an upper surface of the base; a second circuit board including a second driving unit facing the first driving unit, and disposed at an upper surface of the first circuit board; a support member supporting the holder member with respect to the base; and a guide portion protruded from an upper surface of the base, wherein the guide portion supports the second circuit board. In an embodiment, a coil at the second circuit board and a magnet at the holder member may (Continued)

be assembled at a predetermined interval, such that reliability of the product with respect to performance of handshake compensation device can be enhanced.

20 Claims, 11 Drawing Sheets

(51) Int. Cl.
　　*G02B 7/10*　　(2021.01)
　　*G02B 7/105*　　(2021.01)
　　*G02B 7/04*　　(2021.01)
　　*G02B 7/09*　　(2021.01)
　　*G02B 7/02*　　(2021.01)

(52) U.S. Cl.
　　CPC ................ *G02B 7/09* (2013.01); *G02B 7/10* (2013.01); *G02B 7/102* (2013.01); *G02B 7/105* (2013.01); *G02B 27/646* (2013.01)

(58) Field of Classification Search
　　USPC .................................................. 359/822–824
　　See application file for complete search history.

(56) References Cited

U.S. PATENT DOCUMENTS

| | | | |
|---|---|---|---|
| 10,054,799 B2* | 8/2018 | Park | G02B 27/646 |
| 10,520,699 B2* | 12/2019 | Park | G02B 7/023 |
| 2012/0307088 A1 | 12/2012 | Han | |
| 2013/0016427 A1 | 1/2013 | Sugawara | |
| 2013/0050828 A1* | 2/2013 | Sato | G02B 27/646 |
| | | | 359/557 |
| 2013/0119785 A1 | 5/2013 | Han | |
| 2013/0121652 A1 | 5/2013 | Taniguchi et al. | |
| 2013/0194491 A1 | 8/2013 | Kudo | |
| 2015/0022891 A1* | 1/2015 | Hu | G02B 7/08 |
| | | | 359/557 |
| 2016/0178923 A1* | 6/2016 | Hayashi | G02B 27/646 |
| | | | 359/557 |

FOREIGN PATENT DOCUMENTS

| | | |
|---|---|---|
| CN | 104216199 A | 12/2014 |
| EP | 2469333 A1 | 6/2012 |
| EP | 2808717 A2 | 12/2014 |
| JP | H-05-167213 A | 7/1993 |
| JP | H-08-125296 A | 5/1996 |
| JP | 2012-177753 A | 9/2012 |
| JP | 2013-210550 A | 10/2013 |
| KR | 10-0731819 B1 | 6/2007 |
| KR | 10-2014-0112694 A | 9/2014 |
| KR | 10-2014-0140329 A | 12/2014 |
| WO | WO-2013172001 A1 | 11/2013 |

OTHER PUBLICATIONS

Office Action dated Sep. 4, 2019 in Chinese Application No. 201610028599.9.
European Search Report dated Apr. 17, 2020 in European Application No. 20156416.8.
Office Action dated Aug. 13, 2020 in Korean Application No. 10-2015-0007754.
Office Action dated Jun. 29, 2021 in Korean Application No. 10-2015-0011858.

* cited by examiner

LENS DRIVING DEVICE, CAMERA MODULE AND OPTICAL APPARATUS

CROSS-REFERENCE TO RELATED APPLICATIONS

This application is a continuation of U.S. application Ser. No. 15/000,613, filed Jan. 19, 2016; which claims the benefit under 35 U.S.C. § 119 of Korean Application Nos. 10-2015-0007754, filed Jan. 16, 2015; and 10-2015-0011858, filed Jan. 26, 2015, all of which are hereby incorporated by reference in their entirety.

TECHNICAL FIELD

The present exemplary embodiments relate to a lens driving device, a camera module and an optical apparatus.

BACKGROUND

The technology described in this section is merely intended to provide background information of an exemplary embodiment of the present disclosure, and does not mean the prior art.

Concomitant with wide propagation of various mobile terminals and commercialization of wireless Internet services, demands by consumers related to the mobile terminals are diversified, and various types of additional equipment are attached to the mobile terminals.

Among the various types of additional equipment, a camera module may be a representative device capable of editing and transmitting a still image or a moving picture, as necessary, by photographing the still image or the moving picture, and storing the still image or the moving picture in image data.

A camera module may include an image sensor, a PCB (Printed Circuit Board) configured to deliver electric signals to the image sensor installed on the PCB, an infrared cut-off filter configured to block light in infrared area from being incident on the image sensor, and an optical system including at least one lens configured to deliver an image to the image sensor. Here, a lens driving device configured to perform auto-focusing function and handshake compensation function may be installed in the optical system.

The lens driving device may be composed of by a variety of ways. In general, a voice coil motor is commonly used in the lens driving device. The voice coil motor operates by an electromagnetic interaction between a magnet fixed in a housing and a coil unit wound on an outer circumferential surface of a bobbin coupled with a lens barrel. The voice coil motor may perform auto-focusing function. An actuator module of such voice coil motor may reciprocatively move in a direction parallel to an optical axis while a bobbin being moved in upward and downward directions is elastically supported by an upper and a first elastic member.

However, those components may have height deviations depending upon assembly workers, during the process of laminating a plurality of circuit boards on the base in order to implement the handshake compensation function. This is a problem lying in the conventional technology.

Meanwhile, the FPCB (Flexible Printed Circuit Board) used in the lens driving motor is coupled to the OIS (Optical Image Stabilization) coil via a plurality of soldering. Thereby, circuits of the FPCB and the OIS coil are connected to each other.

However, there is still a problem in that the FPCB soldered to the OIS coil may be cracked when an impact such as dropping is applied to the lens driving motor for reliability of the lens driving motor.

BRIEF SUMMARY

In order to solve the problem described in the above, according to an exemplary embodiment, a lens driving device having auto focus and handshake compensation functions is provided.

In addition, according to an exemplary embodiment, there is provided a lens driving device where a distance between a driving magnet and an FP (Fine Pattern) coil can be stably maintained during assembly process.

According to an exemplary embodiment, there is provided a lens driving device that can inhibit cracking in the FCPB even when an impact such as dropping is applied to the lens driving device.

In a general aspect, a lens driving device is provided, comprising: a base; a bobbin disposed at au upper side of the base, and so installed as to be movable upward and downward relative to an optical axis, where a coil unit may be wound on an outer circumferential surface of the bobbin; a holder member including a magnet arranged at a position at a position facing the coil unit; an upper elastic member and a lower elastic member, where one end of each of the upper and the lower elastic members may be respectively coupled to the bobbin and the holder member and elastically supporting the bobbin; a sensing unit arranged at a position facing the magnet of the bobbin and configured to sense change in magnetic force of the magnet; and a handshake compensation means installed at the base and move the holder member in a direction perpendicular to the optical axis, wherein the handshake compensation means includes: a first circuit board accommodated at the base; a second circuit board integrally formed with the second coil; and a first guide portion protruded on the base and guiding an installed position of the first circuit board and the second circuit board, wherein an upper surface of the first guide portion may penetrate through the first circuit board and surface-contact a bottom surface of the second circuit board.

In some exemplary embodiments, the first circuit board may further include a first guide groove through which the first guide portion penetrates.

In some exemplary embodiments, the first circuit board may include: a first connecting portion connected to a conductive connecting portion provided at the base.

In some exemplary embodiments, the second circuit board may include: a second connecting portion arranged at a position corresponding to that of the first connecting portion, and conductively connected to the first connecting portion and the conductive connecting portion.

In some exemplary embodiment, the sensing unit may include: a sensing magnet installed at an outer circumferential surface of the bobbin; and a position detection sensor disposed at an inner surface facing the sensing magnet.

In some exemplary embodiments, the cover member may be formed as a ferromagnetic body.

In some exemplary embodiments, the bobbin may be arranged at a position where the sensing magnet is not interfered with the coil unit.

In some exemplary embodiments, the sensing magnet and the correction magnet may be so arranged as not to face the magnet.

In some exemplary embodiments, the position detection sensor may be provided as a Hall sensor.

In another general aspect, there is provided a camera module, comprising: an image sensor, a PCB including the image sensor mounted thereon; and a first lens driving device configured as described in the above.

In still another general aspect, there is provided a lens driving device, comprising: a coil unit configured to generate electromagnetic field when electric power is supplied; a base layer; a circuit layer laminated on the base layer; a cover layer laminated on the circuit layer; a copper portion provided at an edge of the and coupled by being soldered to the coil unit; and an FPCB coupled to the coil unit and configured to supply electric power to the coil unit, wherein the copper portion may be disposed at a first surface of the base layer, a second surface facing the first surface, and a third surface connecting the first surface and the second surface.

In some exemplary embodiments, a part of the copper portion may be disposed between the base layer and the cover layer.

In some exemplary embodiments, the FPCB may include a penetration hole penetrating through the FPCB, and the copper portion may be disposed at an outer edge or at an edge of the penetration hole.

In some exemplary embodiments, the base layer may be formed of a polyimide.

In still another exemplary embodiment, there is provided a lens driving device, comprising: a coil unit configured to generate electromagnetic field when electric power is supplied; a base layer; a circuit layer laminated on the base layer; a cover layer laminated on the circuit layer; a copper portion provided at an edge of the and coupled by being soldered to the coil unit; and a first FPCB and a second FPCB coupled to the coil unit and configured to supply electric power to the coil unit, wherein the copper portion may be disposed at a first surface of a base layer of the first FPCB, a second surface of a base layer of the second FPCB facing the first surface, and a third surface connecting a lateral portion connected from the first surface and a lateral portion connected from the second surface.

In some exemplary embodiments, a part of the copper portion may be disposed between the base layer of the firsts FPCB and the cover layer, or between the base layer of the second FPCB and the cover layer.

In some exemplary embodiment, the first FPCB and the second FPCB may include a penetration hole penetrating therethrough, and the copper portion may be disposed at an outer edge of base layer or at an edge of the penetration hole.

In some exemplary embodiments, the base layer may be formed of a polyimide.

In still another general aspect, there is provided a lens driving device, comprising: a holder member; a first driving unit disposed at the holder member; a base disposed at a lower side of the holder member and spaced apart from the holder member; a first circuit board disposed at an upper surface of the base; a second circuit board including a second driving unit facing the first driving unit, and disposed at an upper surface of the first circuit board; a support member supporting the holder member with respect to the base; and a guide portion protruded from an upper surface of the base, wherein the guide portion may support the second circuit board.

In some exemplary embodiments, an upper surface of the guide portion may contact a lower surface of the second circuit board.

In some exemplary embodiments, the base may include an opening penetrating through an inside of the base in a vertical direction, and the guide portion may include a first guide portion contacting an inner circumferential surface forming the opening of the base and a second guide portion contacting an outer circumferential surface of the base.

In some exemplary embodiments, the first guide portion may include a plurality of guide protrusions, and the plurality of guide portions may be arranged along the inner circumferential surface of the base by being spaced apart from each other.

In some exemplary embodiments, the first circuit board may include a first guide groove through which the first guide portion penetrates.

In some exemplary embodiments, the second guide portion may be extended along an outer circumferential surface of the base.

In some exemplary embodiment, the first circuit board may not be overlapped with the second guide portion in a vertical direction.

In some exemplary embodiments, the first circuit board may include a first connecting portion, and the second circuit board may include a second connecting portion arranged at a position corresponding to that of the first connecting portion and conductively connected with the first connecting portion.

In some exemplary embodiments, the support member may be conductively connected with at least one of the first connecting portion and the second connecting portion.

In some exemplary embodiments, the base may include a grooved portion formed by being recessed downward from an upper surface, the first connecting portion and the second connecting portion may be connected to each other by soldering, and the first circuit board may be fixed by being adhered to an epoxy disposed at the grooved portion.

In some exemplary embodiments, the lens driving device may further comprise: a bobbin disposed at an inside of the holder member; a third driving unit disposed at the bobbin, and facing the first driving unit; an upper elastic member coupled to an upper portion of the holder member and an upper portion of the bobbin; and a lower elastic member coupled to a lower portion of the holder member and a lower portion of the bobbin.

In some exemplary embodiments, the lens driving device may further comprise: a sensing magnet disposed at a lateral surface of the bobbin; a correction magnet disposed at another lateral surface of the bobbin, and establishing magnetic force equilibrium with the sensing magnet; and a position detection sensor disposed at the holder member, and configured to detect the sensing magnet.

In some exemplary embodiments, the first driving unit may include a magnet, the second driving unit may include a fine pattern coil, and the third driving unit may include a coil.

In still another general aspect, there is provided a camera module, comprising: a holder member; a first driving unit disposed at the holder member; a base disposed at a lower side of the holder member by being spaced apart from the holder member; a first circuit board disposed at an upper surface of the base; a second circuit board including a second driving unit facing the first driving unit, and disposed at an upper surface of the first circuit board; a support member supporting the holder member with respect to the base; and a guide portion protruded from an upper surface of the base, wherein the guide portion may support the second circuit board.

In still another general aspect, there is provided an optical apparatus, comprising: a holder member; a first driving unit disposed at the holder member; a base disposed at a lower side of the holder member by being spaced apart from the holder member; a first circuit board disposed at an upper surface of the base; a second circuit board including a second driving unit facing the first driving unit, and disposed at an upper surface of the first circuit board; a support member supporting the holder member with respect to the base; and a guide portion protruded from an upper surface of the base, wherein the guide portion may support the second circuit board.

According to an exemplary embodiment, during assembly process, an upper surface of the first guide portion integrally formed with the base may be so assembled as to penetrate through the first circuit board and as to surface-contact a bottom surface of the second circuit board. Therefore, the second coil disposed at the second circuit board and the magnet disposed at the holder member may be assembled at a predetermined interval, such that reliability of the product with respect to performance of handshake compensation device can be enhanced. In addition, the position information of the bobbin and the holder member can be correctly received as a feedback.

According to an exemplary embodiment, the cover layer of the FPCB used in the lens driving device may be so extended not only as to cover the circuit layer, but also as to cover an end of the copper portion. Thereby, the FCPB can be prevented from being cracked even when an impact such as dropping is applied to the lens driving device, and the reliability of the product can be enhanced as well.

DETAILED DESCRIPTION

Figure 1:
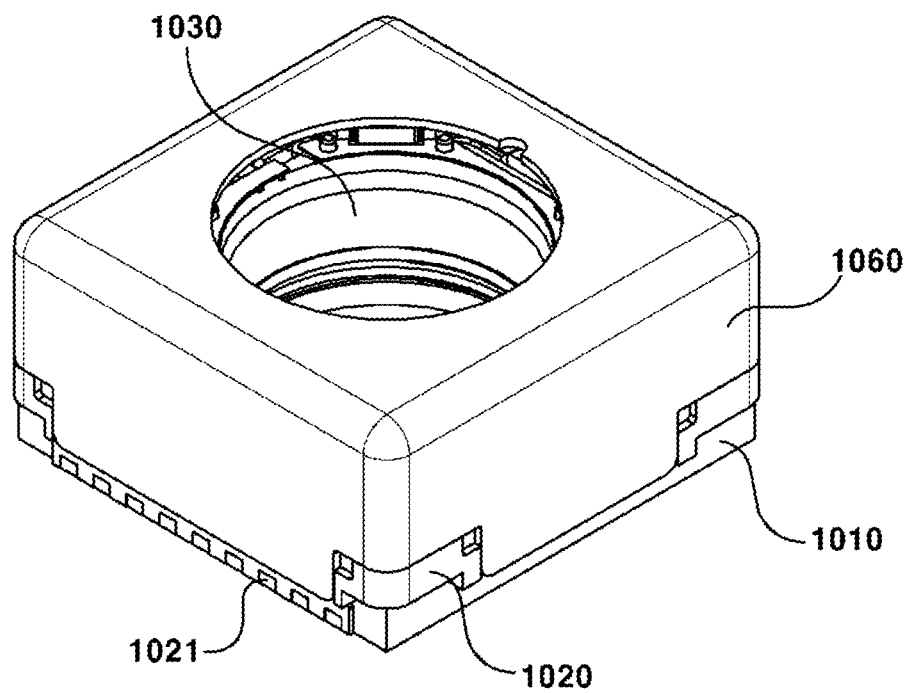
FIG. 1 is a schematic perspective view illustrating a camera module according to a first exemplary embodiment.

Hereinafter, exemplary embodiments of the present disclosure will be described with reference to the exemplary drawings. In designating elements in the drawings as reference numerals, wherever possible, the same reference numerals are used to refer to the same element, even though the same elements are illustrated in different drawings. In addition, in describing exemplary embodiments of the present disclosure, when it is determined that a detailed description about known function or structure relating to the present disclosure may disturb understanding of exemplary embodiments of the present disclosure, the detailed description may be omitted.

In addition, in describing elements of exemplary embodiments of the present disclosure, the terms such as "first", "second" "A", "B", "(a)" and "(b)" may be used. However, such terms are used merely to distinguish a particular element from another element, and therefore, essence, order or sequence of the relevant elements shall not be limited by the terms. It will be understood that when an element is referred to as being "connected", "contacted" or "coupled" to another element, it can be directly connected, contacted or coupled to the other elements, or otherwise, an intervening elements may be "connected", "contacted" or "coupled" between the element and the other element.

As used herein, the term "optical axis direction" is defined as a direction of an optical axis of a lens module installed at a lens actuator. Meanwhile, the term "optical axis direction" may be used in combination with the terms such as "up/down direction", "z-axis direction", etc.

As used herein, the term "auto focus function" is defined as a function to focus on the subject by moving the lens module in the optical axis direction according to distance to the subject to adjust the distance between an image sensor and the subject, in order to form a clear image on the image sensor. Meanwhile, the term "auto focus" may be used in combination with the term "AF (Auto Focus)".

As used herein, the term "handshake compensation function" is defined as a function to move or tilt the camera module in a direction perpendicular to the optical axis direction so as to counterbalance trembling (motion) generated by the image sensor due to external force.

Meanwhile, the term "handshake compensation" may be used in combination with the term "OIS (Optical Image Stabilization)".

First Exemplary Embodiment

Hereinafter, a structure of a lens driving device according to a first exemplary embodiment will be described with reference to enclosed drawings.

Figure 2:
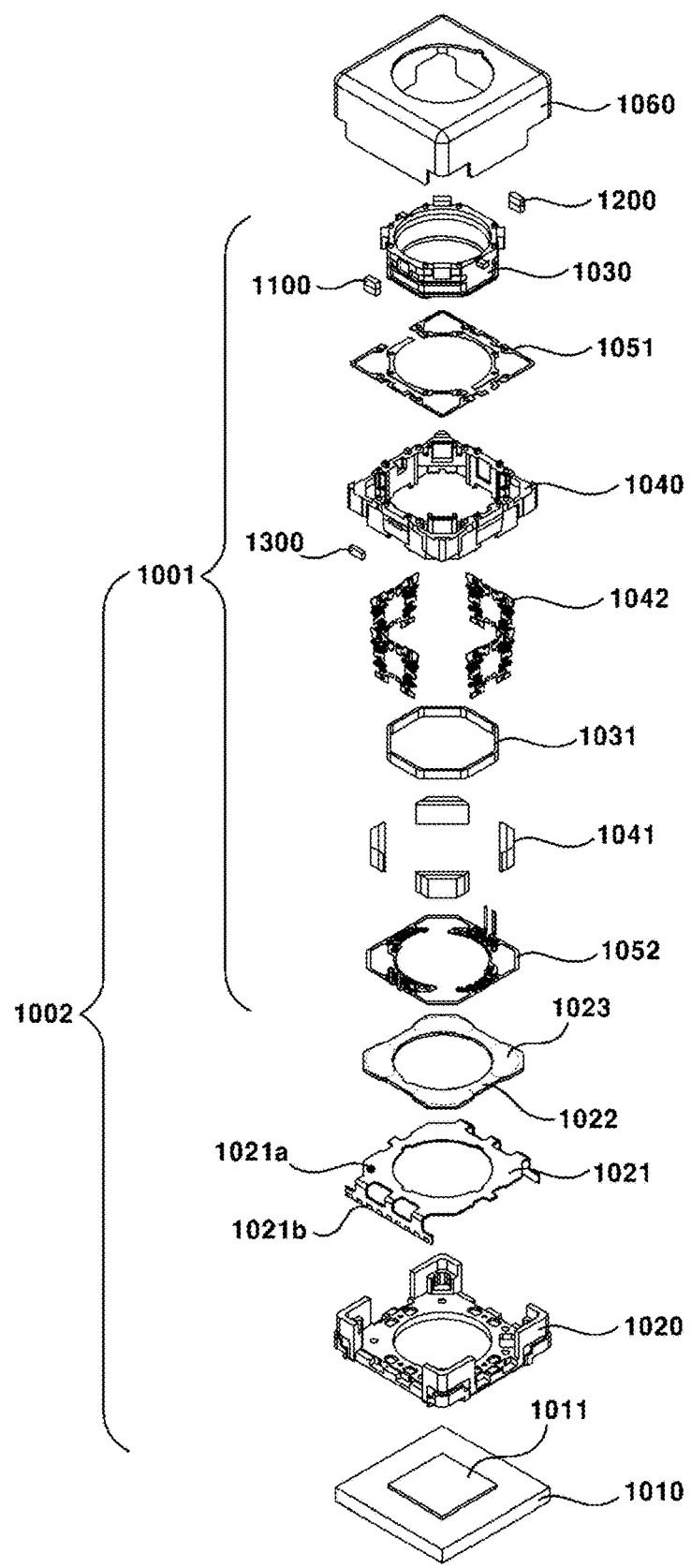
FIG. 2 is an exploded perspective view of FIG. 1.
Figure 3:
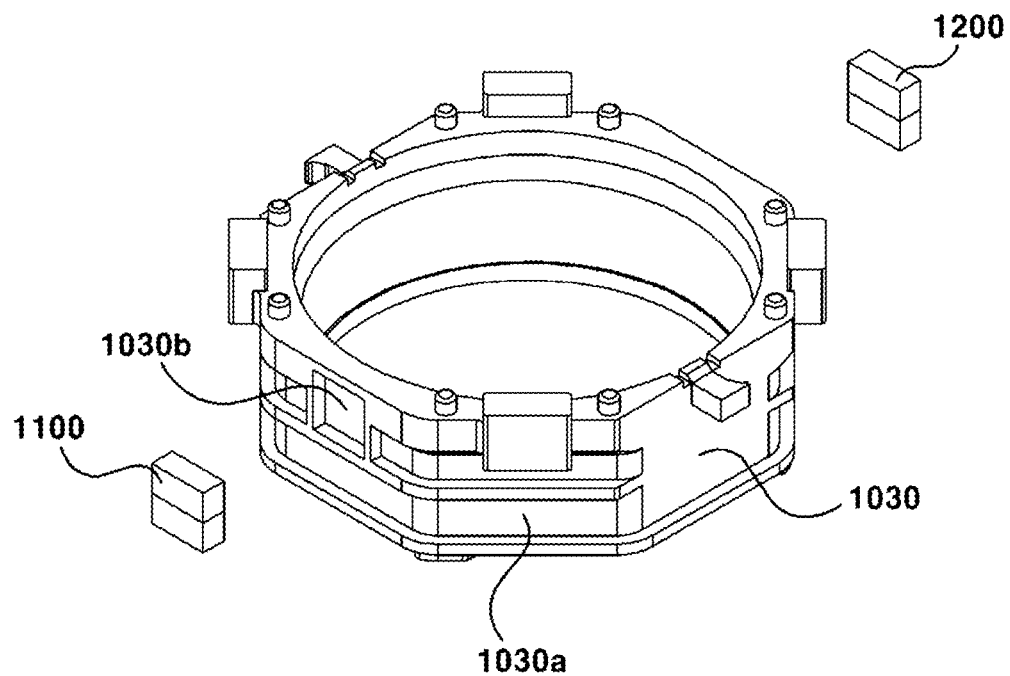
FIG. 3 is a magnified perspective view illustrating a bobbin of FIG. 2.
Figure 4:
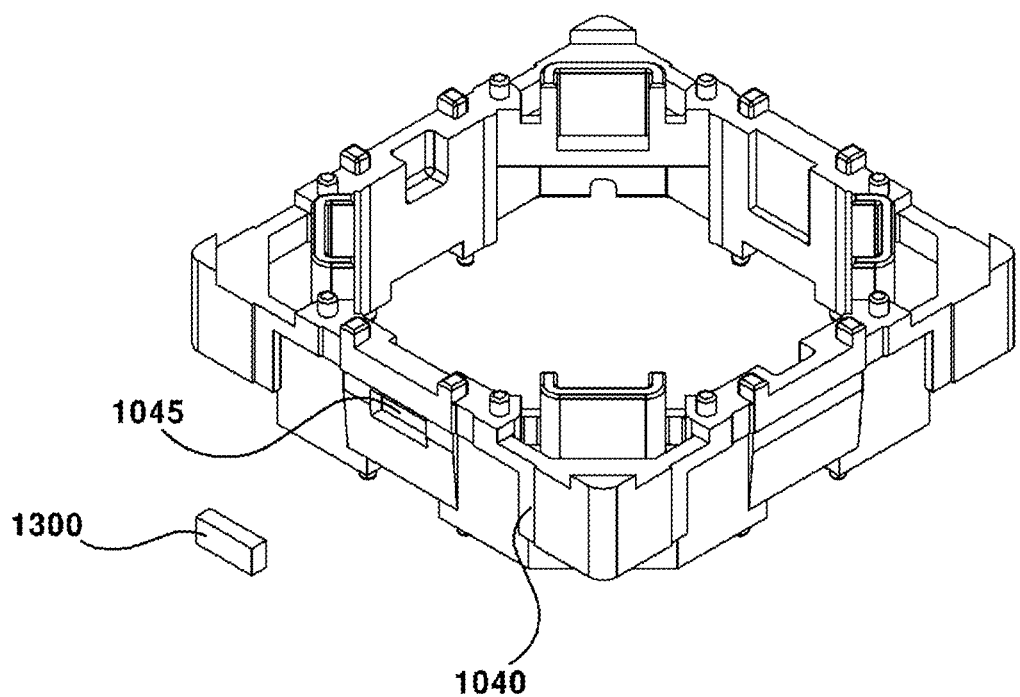
FIG. 4 is a magnified perspective view illustrating a holder member of FIG. 2.
Figure 5:
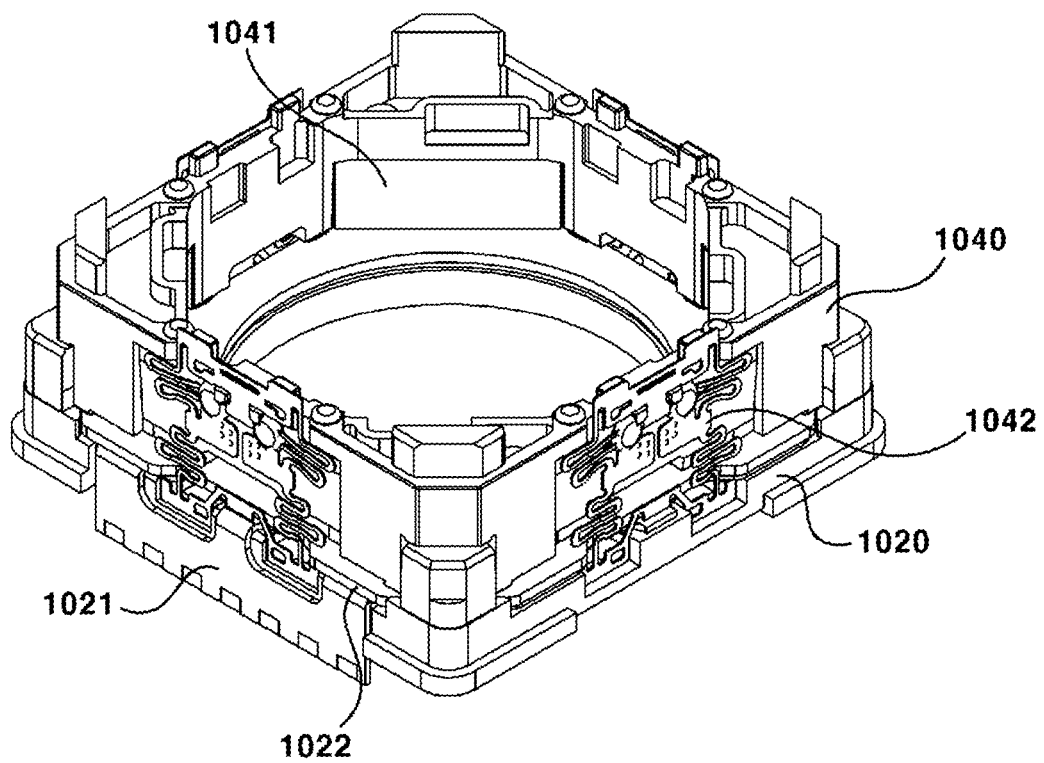
FIG. 5 is a perspective view illustrating a base and a holder member according to a first exemplary embodiment.
Figure 6:
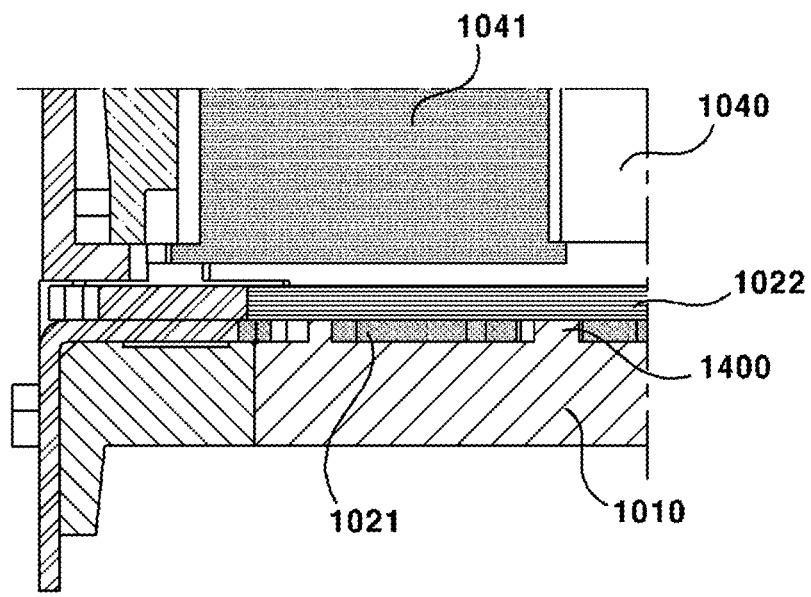
FIG. 6 is an essential cross-sectional view of FIG. 5.
Figure 7:
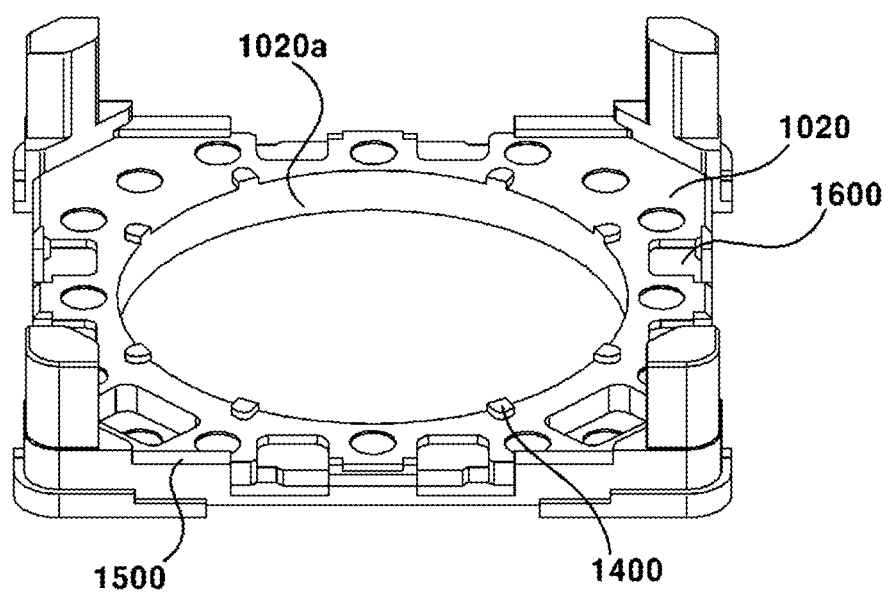
FIG. 7 is a perspective view illustrating a base according to a first exemplary embodiment.
Figure 8:
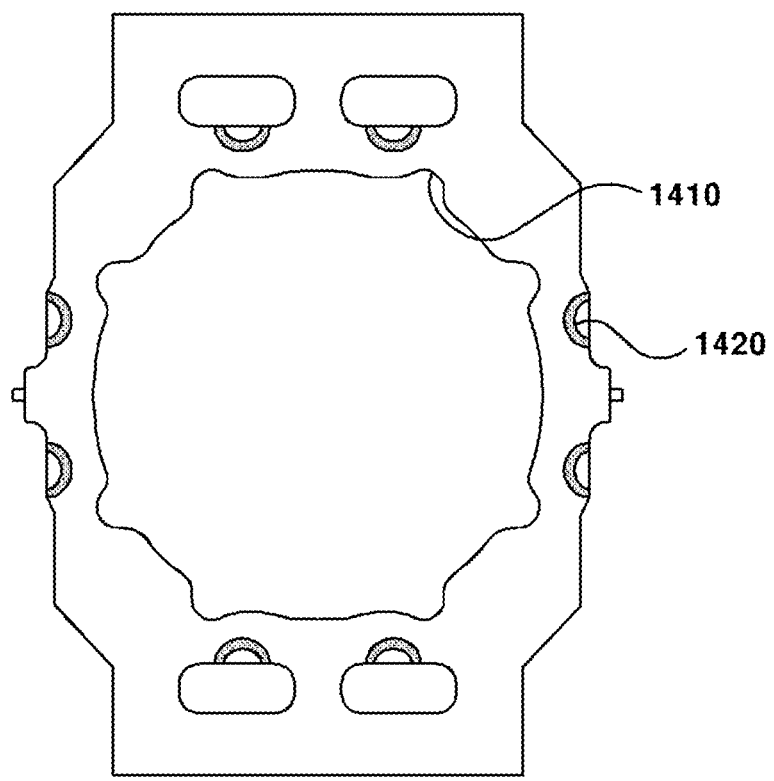
FIG. 8 is a plan view illustrating a first circuit board according to a first exemplary embodiment.
Figure 9:
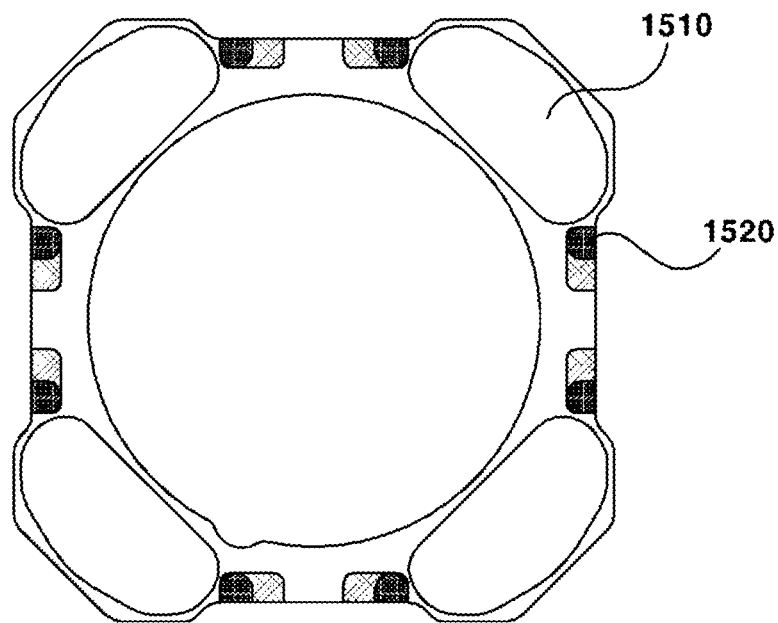
FIG. 9 is a plan view illustrating a second circuit board according to a first exemplary embodiment.

FIG. 1 is a schematic perspective view illustrating a camera module according to a first exemplary embodiment; FIG. 2 is an exploded perspective view of FIG. 1; FIG. 3 is a magnified perspective view illustrating a bobbin of FIG. 2; FIG. 4 is a magnified perspective view illustrating a holder member of FIG. 2; FIG. 5 is a perspective view illustrating a base and a holder member according to a first exemplary embodiment; FIG. 6 is an essential cross-sectional view of FIG. 5; FIG. 7 is a perspective view illustrating a base according to a first exemplary embodiment; FIG. 8 is a plan view illustrating a first circuit board according to a first exemplary embodiment; and FIG. 9 is a plan view illustrating a second circuit board according to a first exemplary embodiment.

The first lens driving unit (1001) may include a base (1020), a bobbin (1030), and a holder member (1040). In addition, a cover member (1060) may be additionally provided to form an external appearance of the camera module. A holder member (1040) supporting a magnet (1041) may be arranged inside of the cover member (1060).

The base (1020) may be coupled to the cover member (1060).

The bobbin (1030) may be installed in an internal space of the cover member (1060) to be reciprocatively movable in an optical axis direction. A first coil (1031) may be installed at a coil accommodation portion (1030a) formed on an outer circumferential surface of the bobbin (1030).

An upper elastic member (1051) and a lower elastic member (1052) may be installed respectively at an upper portion and a lower portion of the bobbin (1030). An end of the upper elastic member (1051) may be connected to the bobbin (1030), and another end of the upper elastic member (1051) may be coupled to the holder member (1040), but not limited hereto. Alternatively, the other end of the upper elastic member (1051) may be coupled to the cover member (1060), as circumstances requires. In a case where the other end of the upper elastic member (1051) is coupled to the holder member (40), the other end of the upper elastic member (1051) may be coupled to an upper surface or a lower surface of the holder member (1040). An end of the lower elastic member (1052) may be connected to the bobbin (1030), and another end of the lower elastic member (1052) may be coupled to an upper surface of the base (1020), or may be coupled to a lower surface of the holder member (1040).

In addition, a protrusion for coupling of the lower elastic member (1052) may be formed on a lower side of the base (1020). A hole or recess may be formed on the lower elastic member (1052), at a position corresponding to the position of the protrusion, such that the lower elastic member (1052) can be fixed by the coupling between the protrusion and the hole or recess. In addition, an adhesive may be additionally used for stronger coupling. Alternatively, the protrusion and the elastic member may be coupled by a method such as thermo-welding process.

Meanwhile, as illustrated in FIG. 2, the upper elastic member (1051) may be provided as two leaf springs in a two-sectional structure. The lower elastic member (1052) may be formed as a single body, so as to function as a socket for being applied with current. That is, the current applied through a terminal (1021b) may be delivered through the two springs of the upper elastic member (1052), and the delivered current may be applied to the first coil (1031) wound on the bobbin (1030). To this end, the upper elastic member (1051) and the first coil (1031) may be conductively connected using a method such as soldering, respectively.

Here, the upper elastic member (1051) may include an external portion coupled to the holder member (1040), an internal portion coupled to the bobbin (1030), and a connection portion connecting the internal portion and the external portion. The internal portion may be electrically connected to both ends of the first coil (1031) using a method such as soldering. That is, both distal ends of the two springs and the first coil (1031) may be electrically connected with each other using means such as soldering, Ag epoxy, welding, conductive epoxy, etc. However, the exemplary embodiment is not limited hereto. Alternatively, in a reverse way, the lower elastic member (1052) may be formed in the two-sectional structure, and the upper elastic member (1051) may be formed as a single body. Alternatively, the upper elastic member (1051) may be possibly formed in a four-or more multi-sectional structure.

Bidirectional movements in the optical axis direction by the bobbin (1030) may be supported by the upper elastic member (1051) and the lower elastic member (1052). That is, the bobbin (1030) may be spaced from the holder member (1040) at a predetermined distance, such that the bobbin (1030) can be controlled to ascend and descend from the initial position of the bobbin (1030) as a center. Alternatively, the initial position of the bobbin (1030) may contact an upper portion or a lower portion of the holder member (1040), such that bobbin (1030) can be controlled to move only upward from the initial position of the bobbin (1030) as a center.

Meanwhile, the first coil (1031) may be provided as a coil block in a shape of ring coupled to an outer circumferential surface of the bobbin (1030), but not limited hereto. That is, a coil may be directly wound on an outer circumferential surface of the bobbin (1030) to form the first coil (1031). As illustrated in FIG. 2, the first coil (1031) may be installed at a position near to a lower surface of the bobbin (1030), and may include a straight surface and a curved surface according to a shape of the bobbin (1030).

Alternatively, the first coil (1031) formed as a coil block may be in an angular shape, for example, may be in an octagonal shape. That is, the first coil (1031) may be all formed of straight surfaces with no curved surface. This is by consideration of electromagnetic interaction with the magnet (1041) disposed oppositely. That is, the electromagnetic force can be maximized, when both surfaces of the magnet (1041) and the first coil (1031) facing each other are flat surfaces. However, the exemplary embodiment is not limited hereto. The surfaces of the magnet (1041) and the first coil (1031) may be formed as all curved surfaces, all flat surfaces, or one as a curved surface and the other as a flat surface, according to its design specification.

In addition, the bobbin (1030) may include a first surface flatly formed on a surface responding to the straight surface and a second surface roundly formed on a surface responding to the curved surface, such that the first coil (1031) can be coupled to an outer circumferential surface of the bobbin (1030), but not limited hereto. That is, the second surface may be also formed as a flat surface.

The holder member (1040) may be formed as a frame roughly in a shape of hexahedron. Coupling structures for the upper and the lower elastic member (1051, 1052) to be coupled may be provide on an upper and a lower surface of the holder member (1040), respectively. A magnet (1041) may be installed at four edge portions of the holder member (1040). Here, an accommodation portion (not illustrated in the drawings) may be formed at a position in which the magnet (1041) is to be installed as illustrated in FIG. 2. However, the present exemplary embodiment is not limited hereto. That is, the magnet (1041) may be adhesively fixed directly to an inner circumferential surface of the holder member (1040). The magnet (1041) may be fixed by being bonded on a side surface or on an edge of the holder member (1040), when the magnet (1041) is directly fixed to the holder member (1040) in such way as described in the above.

Alternatively, the lens driving device may include only a cover member (1060), without including a separate holder member (1040). The cover member (1060) may be formed of a metallic material that is a ferromagnetic substance such as iron. In addition, the cover member (1060) may be provided in an angular shape when viewed from the above, so as to cover a whole of the bobbin (1030). Here, the cover member (1060) may be in a rectangular shape as illustrated in FIGS. 1 and 2. Otherwise, although it is not illustrated in the drawings, the cover member (1060) may be provided in an octagonal shape. In addition, in a case where the cover member (1060) is in an octagonal shape when viewed from the above, if the shape of the magnet (1041) arranged at edges of the holder member (1040) is a trapezoid shape when viewed from the above, then the magnetic field emitted from edges of the holder member (1040) can be minimized.

Meanwhile, the lens driving device according to a first exemplary embodiment may include a detection unit configured to detect motion of the bobbin (1030).

The detection unit may include a sensing magnet (1100) and a first position detection sensor (1300). Here, the first position detection sensor (1300) may be installed at the holder member (1040).

The sensing magnet (1100) may be formed smaller and thinner than the magnet (1041). As illustrated in the drawings, the sensing magnet (1040) may be provided as a rectangle polarized into an upper and a lower portion, but not limited hereto. The sensing magnet (1100) may be formed in a variety of shapes such as square, triangle, polygon, circle, etc.

The sensing magnet (1100) may be installed at an outer circumferential surface of the bobbin (1030). According to an exemplary embodiment, the sensing magnet (1100) may be fixed in a sensing magnet accommodation portion (1030*b*) formed at the bobbin (1030) using such as adhesive, glue, etc. Here, the sensing magnet accommodation portion (1030*b*) may be formed as a concave groove that is concavely formed from an outer circumferential surface of the bobbin (1030), but not limited hereto. Alternatively, an accommodation portion may be formed at a position where the sensing magnet (1100) can be arranged.

The concave depth of the sensing magnet accommodation portion (1030*b*) may be corresponding to the thickness of the sensing magnet (1100). Alternatively, the concave depth of the sensing magnet accommodation portion (1030*b*) may be formed lower or higher than the thickness of the sensing magnet (1100). In addition, the sensing magnet (1100) may be fixed to the sensing magnet accommodation portion (1030*b*) using such as an adhesive, such that the sensing magnet (1100) may not be protruded out of the guide.

In addition, the sensing magnet (1100) may be arranged at a position not interfering with the first coil (1031). That is, when the first coil (1031) is installed at a lower side of the bobbin (1030) as illustrated in FIG. 3, the sensing magnet (1100) may be arranged at an upper side of the bobbin (1030), or vice versa. This is in order to so locate the first coil (1031) as not to affect ascending/descending operations of the bobbin (1030) in the optical axis direction. However, the sensing magnet (1100) may also be arranged between the first coil unit (1031) and the bobbin (1030). Alternatively, the sensing magnet (1100) may be arranged at an upper surface of the first coil (1031) facing the cover member (1060) or the cover member (1060).

The sensing magnet (1100) may be so arranged as not to face the magnet (1041), as illustrated in FIGS. 2 and 3. That is, the sensing magnet (1100) may be so arranged as to face a lateral wall of the holder member (1040) as not to face to the magnet (1041), while two or four pieces of the magnets (1041) may be respectively installed at internal edge portions of the holder member (1040). The reason of such arrangement of the sensing magnet (1100) as not to face the magnet (1041) is, in order to inhibit interference between magnetic force change of the sensing magnet (1100) and magnetic force of the magnet (1041), such that the first position detection sensor (1300) can accurately feedback motions of the bobbin (1030). In addition, the sensing magnet (1100) may be arranged on an upper portion or a lower portion of the magnet (1041), while not facing the magnet (1041).

In addition, the sensing magnet (1100) may be polarized into an upper and a lower portion. Therefore, the first position detection sensor (1300) may detect ascending/descending movement of the sensing magnet (1100), so as to accurately detect ascending/descending operations of the bobbin (1030).

The first position detection sensor (1300) may be conductively connected to the circuit board (1021), and may output a position detection signal of the bobbin (1030). However, the present exemplary embodiment is not limited hereto. A separate board may be arranged on a lateral wall of the holder member (1040), and may be conductively connected with the first position detection sensor (1300).

In addition, as illustrated in FIG. 4, the first position detection sensor (1300) may be inserted in a position detection sensor accommodation portion (1045) formed on an outer circumferential surface of the holder member (1040). Here, an internal side of the lateral wall on which the accommodation portion (1045) is formed may form a concave portion, such that a thickness of the holder member (1040) can become the thinnest at the accommodation portion (1045). According to such structure, the distance between the first position detection sensor (1300) and the sensing magnet (1100) can be minimized, such that motions of the bobbin (1030) can be detected more accurately.

In addition, as illustrated in FIG. 2, a correction magnet (1200) may be additionally installed at a surface facing the surface where the sensing magnet (1100) is installed. However, this is a selectable option.

The correction magnet (1200) may be installed on an outer circumferential surface of the bobbin (1030). According to an exemplary embodiment, the correction magnet (1200) may be fixed to a correction magnet accommodation portion (not illustrated in the drawings) provided on the bobbin (1030) using such as adhesive. Here, the correction magnet accommodation portion may be provided as a concave groove concavely formed on an outer circumferential surface of the bobbin (1030), but not limited hereto. The correction magnet accommodation portion may be formed as a rib on a position where the correction magnet (1200) can be arranged. The correction magnet accommodation portion may be provided in a same shape as that of the sensing magnet accommodation portion described in the above. A concave depth of the correction magnet accommodation portion may be formed corresponding to a thickness of the correction magnet (1200), or otherwise, may be formed lower of higher than the thickness of the correction magnet (1200). Therefore, the correction magnet (1200) may not be protruded out of the guide, when the correction magnet (1200) is fixed to the correction magnet accommodation portion using such as adhesive, glue, etc.

The sensing magnet (1100) and the correction magnet (1200) may be provided in the same size. In addition, a center of the sensing magnet (1100) may be aligned with a center of the correction magnet (1200). According to such structure, the attractive force generated among the sensing magnet (1100), the correction magnet (1200) and the cover member (1060) may be offset with one another, such that the center of the bobbin (1030) is not tilting by being attracted to the cover member (1060) side. Therefore, the bobbin (1030) may not tilt to the cover member (1060) side and may be arranged near the center where the attractive force among the sensing magnet (1100), the correction magnet (1200) and the cover member (1060) establish equilibrium. Thereby, the bobbin (1030) can possibly move in the optical axis direction, with the center of the bobbin (1030) aligned with the optical axis.

Meanwhile, although an exemplary embodiment where the sensing magnet (1100) and the correction magnet (1200) are so disposed as to face a flat straight surface of the cover member (1060) has been described in the above, the present exemplary embodiment is not limited hereto. For example, the sensing magnet (1100) and the correction magnet (1200) may be so disposed as to face an edge side of the cover member (1060). In such case, the first position detection sensor (1300) may be arranged at an edge side of the cover member (1060) at a position corresponding to that of the sensing magnet (1100). In such case, the magnet (1041) may be arranged at a lateral surface of the holder member (1040).

According to another exemplary embodiment, the first position detection sensor (1300) may be arranged at the bobbin (1030), and the sensing magnet (1100) may be arranged at the holder member (1040). Alternatively, the magnet (1041) and the sensing magnet (1100) may be used in common, such that the sensing magnet (1100) may be omitted.

The support member (1042) may support movement of the holder member (1040) in order for the handshake compensation function. The support member (1042) may be formed as a leaf spring or a suspension wire. In addition, the magnet (1041) may be arranged at an edge of the holder member (1040), while the support member (1042) may be arranged at a lateral surface of the holder member (1040), or vice versa.

The first lens driving unit (1001) may be formed as described in the above. Otherwise, the first lens driving unit (1001) may be replaced with an optical system implementing another auto-focusing function, instead of the structure described in the above. That is, the first lens driving unit (1001) may be formed of an optical module using a single-lens moving actuator or an actuator of variable reactive index type, instead of using an auto-focusing actuator of voice coil motor type. That is, any kind of optical actuator which is able to perform auto-focusing function may be used in the first lens driving unit (1001).

Meanwhile, as illustrated in FIGS. 2 and 5, the second lens driving unit (1002) may be a lens driving unit for handshake compensation function. The second lens driving unit (1002) may include the first lens driving unit (1001), a base (1020), a support member (1042), a first circuit board (1021), a second coil (1023), and a second position detection sensor (1021a). According to an exemplary embodiment, the second lens driving unit (1002) may further include a second circuit board (1022), such that the second coil (1023) may be arranged at the second circuit board (1022).

According to an exemplary embodiment, a control element to drive the lens driving device may be installed on the first circuit board (1021). A second coil (1023) in a pattern shape may be formed on the second circuit board (1022). The first and the second circuit board (1021, 1022) may be conductively connected to each other. The second circuit board (1022) may be arranged by being laminated on an upper side of the first circuit board (1021). However, the present exemplary embodiment is not limited hereto. The second lens driving unit (1002) may include only the first circuit board (1021), without the second circuit board (1022). In such case, the second coil (1023) may be assembled on the first circuit board (1021) as a separate component. As illustrated in FIG. 2, the first circuit board (1021) may be provided as an FPCB, and may be installed at an upper surface of the base (1020).

The second circuit board (1022) may be arranged by being laminated on an upper side of the first circuit board (1021). As illustrated in FIG. 6, the second circuit board (1022) may be arranged by being adhered to the first circuit board (1021).

According to a first exemplary embodiment, the first circuit board (1021) and the second circuit board (1022) may be fixed at a predetermined position by the first guide portion (1400) and the second guide portion (1500), such that the first circuit board (1021) and the second circuit board (1022) can be arranged as adhesively close as possible.

The first guide portion (1400) may be integrally formed by being protruded on the base (1020), such that an upper surface of the first guide portion (1400) can penetrate through the first circuit board (1021) and surface-contact a bottom surface of the second circuit board (1022). According to a first exemplary embodiment, as illustrated in FIG. 7, the first guide portion (1400) may be formed by being protruded in a predetermined height at a position near to an inner circumferential surface (1020a) of the base (1020). Here, a plurality of the first guide portion (1400) may be formed by being protruded at a predetermined interval. But, the present exemplary embodiment is not limited hereto. That is, the interval between each of the first guide portions (1400) may be variable, and the first guide portion (1400) may be formed at any position that is not interfering with the existing components and structures.

In addition, the height of the first guide portion (1400) may be consistently formed. According to a first exemplary embodiment, the first guide portion (1400) may have a height corresponding to a thickness of the first circuit board (1021). Accordingly, the first guide portion (1400) may penetrate through a guide groove (1410) provided at the first circuit board (1021), such that an upper surface of the first guide portion (1400) has the same height as that of an upper surface of the first circuit board (1021). Thereby, the upper surface of the first guide portion (1400) and the upper surface of the first circuit board (1021) may together support a bottom surface of the second circuit board (1022).

In another exemplary embodiment, although it is not illustrated, the first guide portion (1400) may be so provided as to penetrate through both of the first circuit board (1021) and the second circuit board (1022). In such case, an upper surface of the first guide portion (1400) may penetrate through a penetration hole (not illustrated) formed on the second circuit board (1022), while the upper surface of the first guide portion (1400) may correspond to an upper surface of the second circuit board (1022). Here, the penetration hole may also be formed on the first circuit board (1021).

As illustrated in FIG. 7, the second guide portion (1500) may be protruded on a circumferential surface of the base (1020). Here, the protruded height of the second guide portion (1500) may be formed as being corresponding to the protruded height of the first guide portion (1400). The second guide portion (1500) may support a bottom of the circumferential surface of the second circuit board (1022), such that the circumferential surface of the second circuit board (1022) can be suppressed from being uplifted. According to a first exemplary embodiment, the second guide portion (1500) may be so formed as to support a bottom surface of the second circuit board (1022) without any separate adhesive member. Alternatively, an upper surface of the second guide portion (1500) may be coated with an adhesive member, and may contact and be fixed to the second circuit board (1022). Therefore, the position of the first circuit board (1021) corresponding to that of the second guide portion (1500) may be escaped.

Meanwhile, according to a first exemplary embodiment, a grooved portion (1600) may be formed on the base (1020). The first circuit board (1021) and the second circuit board (1022) may further include a first connecting portion (1420)

and a second connecting portion (1520) conductively connected with each other, respectively. Therefore, the first connecting portion (1420) and the second connecting portion (1520) of the first circuit board (1021) and the second circuit board (1022) may be fixed by soldering at first, then the grooved portion (1600) and the first circuit board (1021) may be adhered to be fixed on the base (1021) using an adhesive member such as an epoxy. In addition, the grooved portion (1600) may accommodate a solder ball of the first circuit board (1021) and the second circuit board (1022) to be arranged.

As described in the above, the first guide portion (1400) supporting a bottom surface of the second circuit board (1020) may be integrally formed with the base (1020) having relatively low dimensional deviation, such that the bottom surface of the second circuit board (1022) arranged at an upper side of the first circuit board (1021) can directly surface-contact the upper surface of the first guide portion (1400). Thereby, the height of the second circuit board (1022) may be constantly maintained.

In addition, an adhesive member (not illustrated) may be additionally coated on the upper surface of the first guide portion (1400), such that the upper surface of the first guide portion (1400) can be adhered to and fixed on the bottom surface of the second circuit board (1022). At least one of the first guide portion (1400) and the second guide portion (1500) may be provided. Alternatively, both of the first guide portion (1400) and the second guide portion (1500) may be provided.

The second coil (1510) may move the whole of the first lens driving unit (1001) in a direction of a flat surface perpendicular to the optical axis, through an interaction with the magnet (1041). As illustrated in FIG. 2, the second coil (1510) may be formed on the second circuit board (1022) by a pattern coil method. The second coil (1510) may be arranged at each of edge portions of the second circuit board (1022), at a position responding to a bottom surface of the magnet (1041).

As illustrated in FIG. 2, the second position detection sensor (1021*a*) may be installed at the first circuit board (1021), but not limited hereto. The second position sensor (1021*a*) may be arranged separately as an independent component, or otherwise, may be arranged at the second circuit board (1022). Here, the second position detection sensor (1021*a*) may detect movement of the holder member (1040) installed with the magnet (1041) in a direction perpendicular to the optical axis, by detecting magnetic field of the magnet (1041).

According to a first exemplary embodiment as described in the above, time consumed in auto focus operation and handshake compensation operation can be reduced, because the movement of the bobbin (1030) in the optical axis direction may be detected as feedback using the sensing magnet (1100).

According to an exemplary embodiment, the bobbin (1030) may be operated, while the first coil (1031) is wound on the bobbin (1030), the sensing magnet (1100) smaller than the auto-focusing magnet is attached to the bobbin (1030), and the first position detection sensor (1300) configured to detect magnetic force of the sensing magnet (1100) is arranged at a lateral surface of the lens driving device. Thereby, the auto focus function can be performed more precisely and rapidly without concern of degradation in response characteristic.

In particular, according to an exemplary embodiment, the bobbin (1030) may maintain a constant position with respect to the center of the cover member (1060), because the correction magnet (1200) having the same size and magnetic force as those of the sensing magnet (1100) may be installed on an opposite side of the bobbin (1030) while centers of the sensing magnet (1100) and the correction magnet (1200) are aligned with each other, such that the bobbin (1030) is not eccentric to the cover member (1060) side.

Meanwhile, according to an exemplary embodiment, the lens driving device having the sensing magnet (1100) and the correction magnet (1200) formed as illustrated in FIGS. 1 to 5 may be controlled in a single direction, and may also controlled bi-directionally. That is, the base (1020) and the bobbin (1030) may be arranged by adhering onto their initial position. For example, a stopper may be form the initial position by being protruded on the base (2020) side and contacting a bottom surface of the bobbin (2030). Otherwise, although it is not illustrated in the drawings, the stopper may be protruded on the bottom surface of the bobbin (2030) and may be arranged by contacting with an upper surface of the base (2020). In such case, a predetermined prepress may be applied to the upper and the lower elastic member (2051, 2052), such that the initial position of the bobbin (2030) can adhere to the base (2020). Thus, the bobbin (2030) may ascend by the electromagnetic interaction, when electric power is applied. On the contrary, the bobbin (2030) may return to the initial position by the restoring force of the upper and the lower elastic member (2051, 2052), when the electric power is shut off.

Alternatively, the base (1020) and the bobbin (1030) may be arranged by being spaced from the initial position at a predetermined distance. In such case, the upper and lower elastic members (1051, 1052) may be formed in a flat shape with no prepress applied. Otherwise, the upper and lower elastic members (1051, 1052) may be formed with a predetermined prepress applied. In such case, the bobbin (1030) may ascend or descend according to the polarity of current, when the electric power is applied in the initial state where the bobbin (1030) is spaced apart from the base (1020) at a predetermined distance. That is, the bobbin (1030) may ascend the initial position as a standard, when a normal current is applied. In addition, the bobbin (1030) may descend from the initial position as a standard, when a reverse current is applied.

As described in the above, according to an exemplary embodiment, time required for auto-focus operation can be minimized, because more accurate position of the bobbin (1030) can be detected using the sensing magnet (1100), when performing the auto-focus function by controlling the bobbin (1030) to ascend or descend. In particular, the correction magnet (1200) installed at a side facing the sensing magnet (1100) may offset the attractive force between the sensing magnet (1100) and the cover member (1060), such that the bobbin (1030) can move while keeping concentric with the cover member (1060) as far as possible.

The camera module may include a lens moving device formed as described in the above, a lens barrel coupled to the bobbin (1030), an image sensor (1011), and a PCB (1010). Here, the image sensor (1011) may be mounted on the PCB (1010). The PCB (1010) may form a bottom surface of the camera module.

The bobbin (1030) may include a lens barrel. At least one lens may be installed in the lens barrel. The lens barrel may be screw-coupled to an inside of the bobbin (1030), but not limited hereto. The lens barrel may be directly fixed to an inside of the bobbin (1030) by other means than the screw-coupling, or otherwise, one or more lenses may be integrally formed with the bobbin (1030) as a single body without the lens barrel. The lens may be formed of a single piece, or otherwise, may be formed of two or more lenses to compose an optical system.

An infrared cut-off filter may be additionally installed at a position responding to the image sensor (1011) on the base (1020). The base (1020) may be coupled to the holder member (1040). In addition, the base (1020) may support a lower side of the holder member (1040). A separate terminal member may be installed on the base (1020), in order for conductivity with the printed circuit board (1010). The terminal may be integrally formed with the base (1020) using such as surface electrodes. Meanwhile, the base (1020) may function as a sensor holder to protect the image sensor (1011). In such case, a protrusion may be formed in a downward direction along a side surface of the base (1020). However, this is not an essential structure. Therefore, although it is not illustrated in the drawings, a separate sensor holder may be arranged at a lower portion of the base (1020) to function as the sensor holder.

Second Exemplary Embodiment

Hereinafter, a structure of a lens driving device according to a second exemplary embodiment will be described with reference to enclosed drawings.

Figure 10:
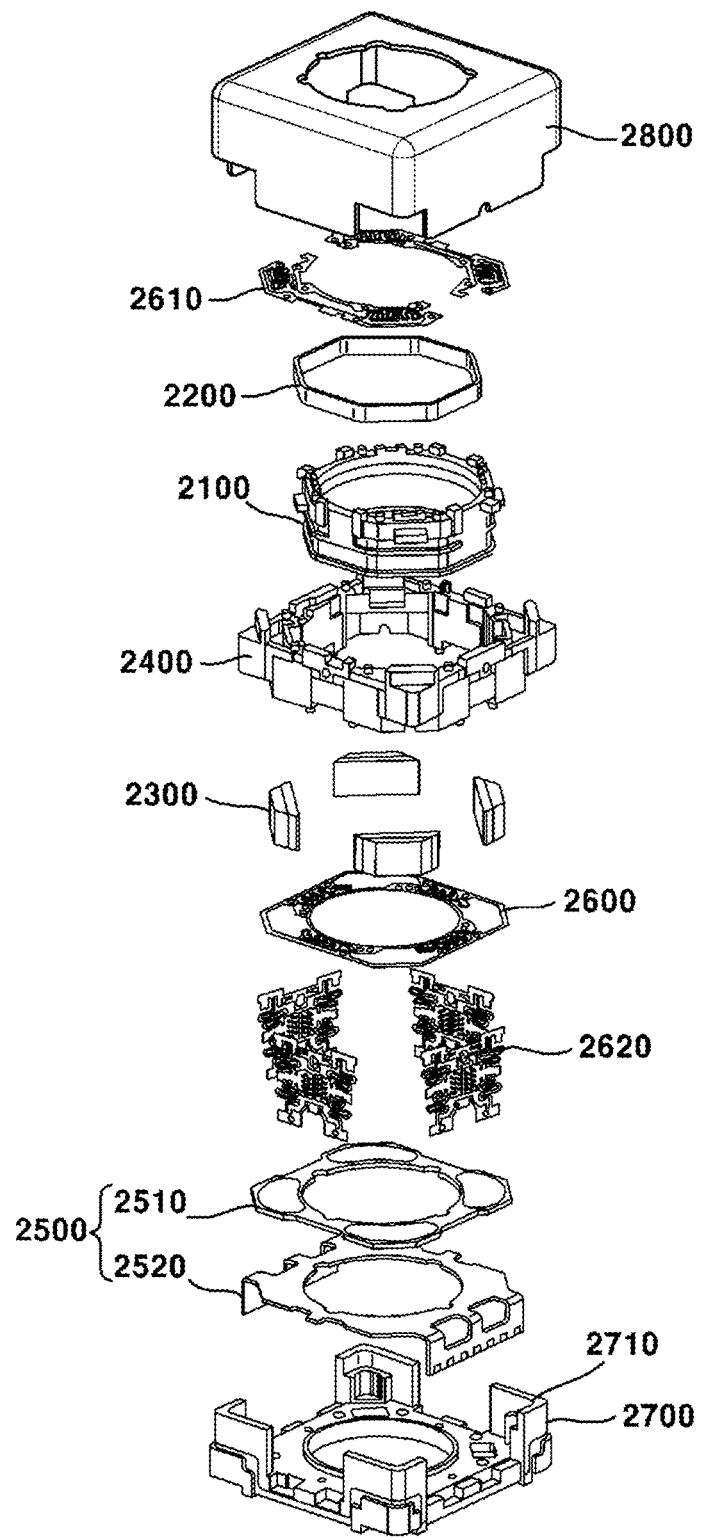
FIG. 10 is an exploded perspective view illustrating a lens driving device according to a second exemplary embodiment.
Figure 11:
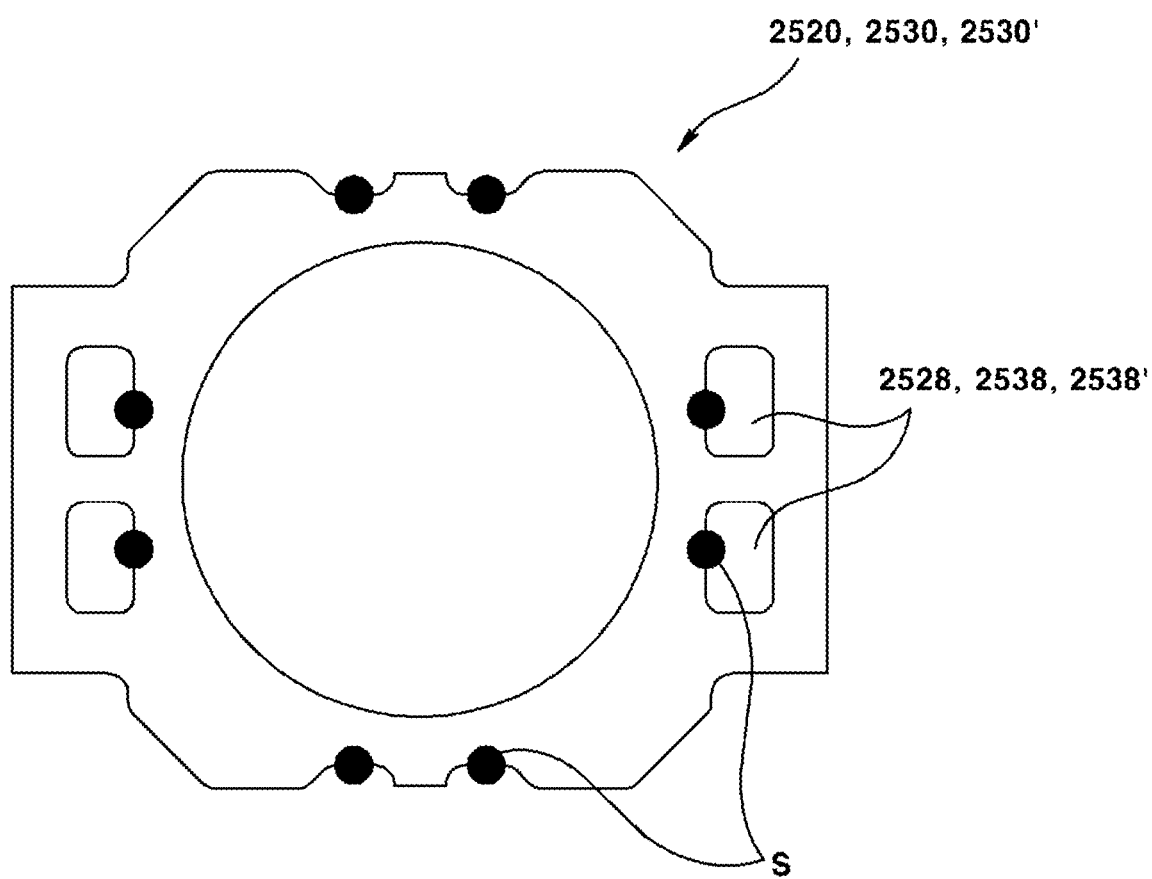
FIG. 11 is a plan view illustrating a coupled state between an FPCB and an OIS coil of a lens driving device according to a second exemplary embodiment.
Figure 12:
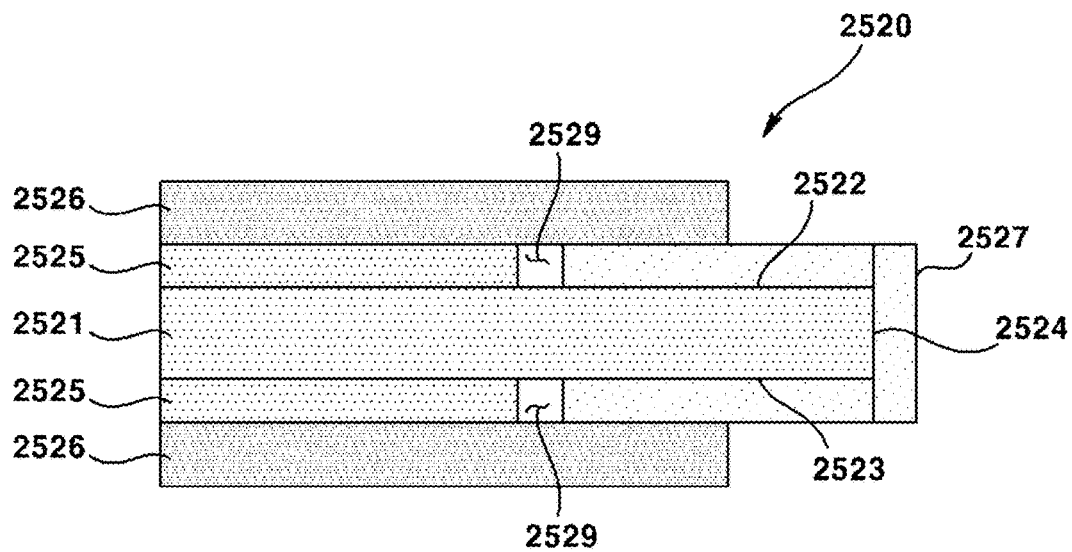
FIG. 12 is a cross-sectional view illustrating an FPCB of a lens driving device according to a second exemplary embodiment.

FIG. 10 is an exploded perspective view illustrating a lens driving device according to a second exemplary embodiment; FIG. 11 is a plan view illustrating a coupled state between an FPCB and an OIS coil of a lens driving device according to a second exemplary embodiment; and FIG. 12 is a cross-sectional view illustrating an FPCB of a lens driving device according to a second exemplary embodiment.

Referring to FIG. 10, the lens driving device according to a second exemplary embodiment may roughly include a bobbin (2100), an AF coil (2200), a magnet (2300), a housing (2400), and may further include a stator (2500), a first elastic member (2600), a second elastic member (2610), an OIS spring (2620), a base (2700), and a cover (2800). In addition, although it is not illustrated, the lens driving device according to a second exemplary embodiment may further include a PCB, an IR (Infrared) filter, an image sensor.

A top and a bottom of the bobbin (2100) may be opened. A center hole in shape of a cylinder may be formed on the bobbin (2100). The center hole formed on the bobbin (2100) may accommodate a lens unit (not illustrated) including at least one lens through which the light to penetrates. The lens unit may be screw-coupled to the bobbin (2100).

The AF coil (2200) may be wound at an outside of the bobbin (2100).

The magnet (2300) may be provided in plural number and facing the AF coil (2200) wound at an outside of the bobbin (2100). Gaps between two adjacent magnets (2300) may be arranged at a same interval in a case where a plural number of magnets are provided. When current flows in the AF coil (2200), an electromagnetic filed is formed at the AF coil (2200), and the magnet (2300) may electromagnetically interact with the AF coil (2200) to move the bobbin (2100) upward and downward.

A center hole may be formed on the housing (2400). A top and a bottom of the housing (2100) may be opened. The housing (2400) may accommodate the bobbin (2100), and the bobbin (2100) may move upward and downward in the housing (2400). The housing (2400) may include a rib (not illustrated in the drawings) in shape of a plate diagonally extend from a side to another adjacent side at an inside of an edge of the housing (2400). An internal space of the edge of the housing (2400) may be divided into an upper portion and a lower portion by the rib. A magnet accommodating portion may be provided, such that the magnet (2300) may be accommodated while an upper surface of the magnet (2300) contacts an upper surface of the rib. Although it is not illustrated, the upper surface of the rib may be so arranged as to face a lower surface of a stopper formed on an outer surface of the bobbin (2100) toward the outside.

The elastic member may be categorized by a first elastic member (2600) and a second elastic member (2610).

The first elastic member (2600) may be formed in shape of a leaf spring and arranged at a lower portion of the housing (2400). A hole for the light to penetrate through the lens unit may be formed on the first elastic member (2600). An upper surface of the first elastic member (2600) at a periphery of the hole may contact a lower portion of the bobbin (2100), such that the first elastic member (2600) can elastically support the bobbin (2100) from the housing (2400).

The second elastic member (2610) may be arranged at an upper portion of the housing (2400). A hole for the light to penetrate through the lens unit may be formed on the second elastic member (2610). An upper surface of the second elastic member (2610) at a periphery of the hole may contact an upper portion of the bobbin (2100), such that the second elastic member (2610) can elastically support the bobbin (2100) from the housing (2400).

Since the first and second elastic members (2600, 2610) elastically support the bobbin (2100) that is moved up/downward by the magnet (2300), the first and second elastic members (2600, 2610) may return the bobbin (2100) to its original position. Meanwhile, the arrangement of the first and second elastic members (2600, 2610) is mentioned in the present exemplary embodiment. However, the present exemplary embodiment is not limited hereto. The first and second elastic members (2600, 2610) may be arranged variously according to the user's selection.

A pillar (2710) may be formed at each edge of the base (2700). The housing (2400) may be arranged at an internal side of the pillar (2710). The base (2700) may support the housing (1400) through the OIS spring (2620), such that the housing (1400) can be movable. Since the housing (2400) supported by the base (2700) is spaced apart from the pillar (2710), the housing (2400) may move in a horizontal direction within the spaced distance. However, although it is illustrated and described that the pillar (2710) is formed at each edge of the base (2700) in the present exemplary embodiment, any structure where a space formed at the base (2700) such that the housing (2400) can move in a horizontal direction may be implemented. A hole through which the light that has penetrated through the lens unit can penetrate may be formed at the base (2700). The stator (2500) and the first elastic member (2600) may be arranged between the base (2700) and the housing (2400). The stator (2500) may include a coil unit (2510) and an FPCB (2520).

The coil unit (2510) may be an OIS coil, and may be arranged at a lower side of the first elastic member (2600). The coil unit (2510) may be arranged at an upper side of the FPCB (2520). The coil unit (2510) may include a hole formed to allow the light that has penetrated through the lens unit to penetrate through the hole. The first elastic member (2600) may be arranged between the coil unit (2510) and the housing (2400). The coil unit (2510) may face a lower portion of the magnet (2300) with a penetration hole (not illustrated) formed on the first elastic member (2600) therebetween.

To describe more particularly, the coil unit (2510) may include an OIS coil facing a lower surface of the magnet (2300). That is, an OIS coil may be so formed at an edge of the coil unit (2510) as to face the magnet (2300). The coil unit (2510) may perform a function to compensate handshakes of the user by moving the bobbin (2100) installed with the lens unit and the housing (2400) in horizontal directions relative to the image sensor (to be described hereinafter). That is, a magnetic field is formed at the coil unit (2510), when the current flows in the coil unit (2510). Thereby, the housing (2400) and the bobbin (2100) accommodated in the housing (2400) may be moved in horizontal directions by the electromagnetic interaction with the magnet (2300).

The FPCB (2520) may apply electric power to the coil unit (2510). The FPCB (2520) may be arranged at a lower side of the coil unit (2510). The FPCB (2520) may include a hole where light can penetrate through the lens unit. The FPCB (2520) may transfer the current supplied through a terminal formed at a lateral side of the FPCB (2520) to the coil unit (2510) or to the OIS spring (2620). The current transferred to the OIS spring (2620) may be supplied to the AF coil (2200) through the second elastic member (2610), such that a magnetic field can be formed at the AF coil (2200) or the coil unit (2510).

The OIS spring (2620) may be arranged at a lateral surface of the housing (2400). The OIS spring (2620) may elastically support the housing (2400) with respect to the base (2700). The OIS spring (2620) may perform a function to return the bobbin (2100) and the housing (2400) that have moved in a horizontal direction with respect to the image sensor (to be described hereinafter) to their original position.

Although not illustrated in the drawings, a PCB may be arranged at a lower side of the base (2700). An image sensor configured to convert the light that has penetrated through the lens module into an electrical signal may be mounted at a periphery of an upper center of the PCB. Components for operation of the image sensor may be arranged at the PCB, or a plurality of terminals configured to supply electric power and to output information of the image sensor may be provided at the PCB. In addition, an infrared cut-off filter configured to filter an infrared ray before the light that has penetrated through the lens module arrives at the image sensor may be installed at the base (2700).

The cover (2800) may be a shield can that is arranged at an outside of the housing (2400) and covering the components mentioned in the above. In addition, the cover (2800) may be formed of metal. The cover (2800) may include a hole where the light can penetrate through the lens unit.

Referring to FIG. 11, the FPCB (2520) may include a terminal portion (of which reference number not assigned) formed at a lateral portion and another lateral portion facing the lateral portion, such that the terminal portion may be electrically connected to the PCB to supply electric power.

The FPCB (2520) may include a groove (of which reference number not assigned) at a lateral portion thereof or at a lateral portion thereof facing another lateral portion. An OIS spring (2620) may be inserted in the groove. In addition, the FPCB (2520) may include a penetration hole (2528) formed between a hole through which the light can penetrate through and a terminal portion. The OIS spring (2528) may penetrate through the penetration hole (2528). In FIG. 11, reference symbol 'S' refers to a portion where the FPCB (2520) and the coil unit (2510) are soldered to each other.

According to a second exemplary embodiment, the FPCB (2520) may be arranged at a lower side of the coil unit (2510). Referring to FIG. 12, the FPCB (2520) may include a base layer (2521), a circuit layer (2525), a cover layer (2526), and a copper layer (2527). The FPCB (2520) may be coupled by being soldered to the coil unit (2510).

The base layer (2521) may be formed as a plate body, and may be formed of a polyamide.

The circuit layer (2525) may be laminated on the base layer (2521). In other words, the circuit layer (2525) may be formed on the base layer (2521) in a predetermined pattern. That is, the pattern may be formed by performing light exposure, etching, and developing on the base layer (2521) and eliminating a dry film therefrom. In addition, the circuit layer (2525) may be formed of a conductive material such as copper (Cu). Therefore, once the electric power is supplied to the FPCB (2520), the current may flow along the predetermined pattern on the circuit of the FPCB (2520).

The cover layer (2526) may be laminated on the circuit layer (2525). The cover layer may be formed of a coverlay film. The cover layer (2526) may be separated from the base layer (2521) by a distance of a thickness of the circuit layer (2525). A separating portion (2529) may be formed at a portion where the circuit layer (2525) is not formed between the cover layer (2526) and the base layer (2521), such that an empty space can be formed. According to the second exemplary embodiment, strength of the FPCB (2520) may be enhanced by the separating portion (2529). However, although it is described in the second exemplary embodiment that the separating portion (2529) is provided, the cover layer (2526) may be laminated on all of the circuit layer (2525) laminated on the base layer (2521) and the portion where the circuit layer (2525) is not formed, such that the separating portion (2529) may not be present.

The circuit layer (2525) and the cover layer (2526) may be sequentially laminated on both surface of the base layer (2521) of the FPCB (2520). In addition, the FPCB (2520) may include a via hole (not illustrated in the drawings) such that the both surface of the FPCB (2520) can be conductively connected to each other.

The copper portion (2527) may be disposed at an outer edge of the FPCB (2520), or may be disposed at an edge of the penetration hole (2528). In addition, the copper portion (2527) may be disposed at an end portion of the base layer (2521). To describe more particularly, the copper portion (2527) may be disposed at a first surface (2522) of the base layer (2521), a second surface (2523) facing the first surface (2522), and a third surface (2524) connecting the first surface (2522) and the second surface (2523). The copper portion (2527) may not be installed at each of the first to third surfaces (2522, 2523, 2524) by being divided, but may be formed by being extended on the first to third surfaces (2522, 2523, 2524). In addition, a part (an end portion) of the copper portion (2527) may be disposed between the base layer (2521) and the cover layer (2526). In other words, the cover layer (2526) may cover an end portion of the copper portion (2527).

The copper portion (2527) may also be formed of a conductive material such as copper, like the material of the circuit layer (2525). Here, in a case the circuit layer (2525) formed on the first surface (2522) and the second surface (2523) is connected to the copper portion (2527), the copper portion (2527) may electrically connect the circuit layers (2525) printed on the both surfaces of the FPCB (2520) with each other, just like the via hole may do.

Although it is illustrated in FIG. 12 that the copper portion (2527) is separated from the circuit layer (2525) via the separating portion (2529), it is one of exemplary embodiments. In another exemplary embodiment, the copper portion (2527) may be connected to the circuit layer (2525). The copper portion (2527) of the FPCB (2520) may be soldered to the coil unit (2510), such that the FPCB (2520) and the coil unit (2510) can be coupled to each other. Thereby, the current flowing in the circuit layer (2525) of the FPCB (2520) may be transferred to the coil unit (2510). Therefore, the housing (2400) may be moved horizontally relative to the optical axis by Fleming's left hand rule through mutual electromagnetic interaction between the magnet (2300) and the coil unit (2510), when the current is supplied to the coil unit (2510).

Since the cover layer (2526) may not only cover the circuit layer (2525), but also may cover and support an end portion of the copper portion (2527). Thereby, the FCPB (2520) can be prevented from being cracked even when an impact such as dropping is applied to the lens driving device according to an exemplary embodiment. Therefore, the defect rate of the product can be reduced as well.

Third Exemplary Embodiment

Hereinafter, a structure of a lens driving device according to a third exemplary embodiment will be described with reference to enclosed drawings. Meanwhile, in describing the third exemplary embodiment, the same reference numerals will be given to the structure same as that of the second exemplary embodiment, and the detailed description previously provided in relationship to the second exemplary embodiment may not be repeated.

Figure 13:
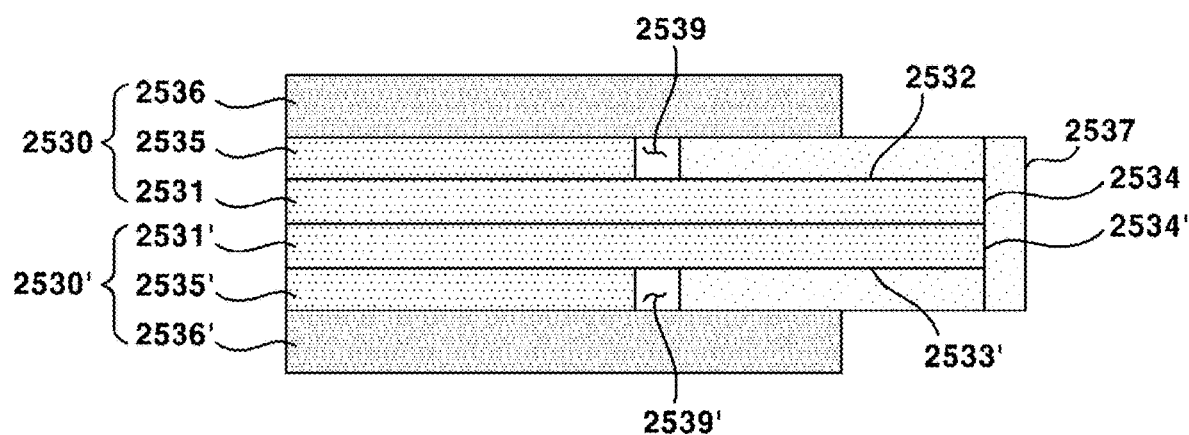
FIG. 13 is a cross-sectional view illustrating an FPCB of a lens driving device according to a third exemplary embodiment.

FIG. 13 is a cross-sectional view illustrating an FPCB of a lens driving device according to a third exemplary embodiment.

According to the third exemplary embodiment, the FPCB (2520) may include a first FPCB (2530) and a second FPCB (2530'). Therefore, the second exemplary embodiment may be different from the first exemplary embodiment including one FPCB (2520).

Referring to FIG. 13, according to the third exemplary embodiment, the first FPCB (2530) and the second FPCB (2530') may be formed as a plated body, respectively. The first FPCB (2530) may include a base layer (2531), a circuit layer (2535), and a cover layer (2536). The second FPCB (2530') may include a base layer (2531'), a circuit layer (2535'), and a cover layer (2536'). Here, the FPCB (2520) may further include a copper layer (2537). The first FPCB (2530) and the second FPCB (2530') may be coupled by being soldered to the coil unit (2510).

The base layer (2531, 2531') may be formed as a plate body, and may be formed of a polyamide.

The circuit layer (2535, 2535') may be laminated on the base layer (2531, 2531'). In other words, the circuit layer (2535, 2535') may be formed on the base layer (2531, 2531') in a predetermined pattern. That is, the pattern may be formed by performing light exposure, etching, and developing on the base layer (2531, 2531') and eliminating a dry film therefrom. In addition, the circuit layer (2535, 2535') may be formed of a conductive material such as copper (Cu). Therefore, once the electric power is supplied to the FPCB (2520), the current may flow along the predetermined pattern on the circuit of the FPCB (2520).

The cover layer (2536, 2536') may be laminated on the circuit layer (2535, 2535'). The cover layer may be formed of a coverlay film. The cover layer (2536, 2536') may be separated from the base layer (2531, 2531') by a distance of a thickness of the circuit layer (2535, 2535'). A separating portion (2539, 2539') may be formed at a portion where the circuit layer (2535, 2535') is not formed between the cover layer (2536, 2536') and the base layer (2531, 2531'), such that an empty space can be formed. According to the second exemplary embodiment, strength of the FPCB (2520) may be enhanced by the separating portion (2529). However, although it is described in the second exemplary embodiment that the separating portion (2539, 2539') is provided, the cover layer (2536, 2536') may be laminated on all of the circuit layer (2535, 2535') laminated on the base layer (2531, 2531') and the portion where the circuit layer (2535, 2535') is not formed, such that the separating portion (2539, 2539') may not be present.

The base layer (2531) of the first FPCB (2530) and the base layer (2531') of the second FPCB (2530') may contact each other. The circuit layer (2525) and the cover layer (2526) may be sequentially laminated on the base layer (2535, 2535') of first FPCB (2530) and the second FPCB (2530'), respectively. In other words, the circuit layer (2535) may be laminated on a surface (a first surface (2532)) of the base layer (2531) of the first FPCB (2530), and the cover layer (2536) may be laminated on a surface of the circuit layer (2535). The circuit layer (2535') may be laminated on a surface (a second surface (2533')) of the base layer (2531') of the second FPCB (2530'), and the cover layer (2536') may be laminated on a surface of the circuit layer (2535'). In addition, other surfaces not laminated with the circuit layer (2535, 2535') of the base layer (2531) of the first FPCB (2530) and the base layer (2531') of the second FPCB (2530') may contact each other.

In addition, the first FPCB (2530) and the second FPCB (2530') may include a via hole (not illustrated in the drawings) such that the first FPCB (2530) and the second FPCB (2530') can be conductively connected to each other. The via hole may be formed in correspondence with the first FPCB (2530) and the second FPCB (2530').

The copper portion (2537) may be disposed at outer edges of the first FPCB (2530) and the second FPCB (2530'), or may be disposed at an edge of the penetration hole (2538, 2538'). In addition, the copper portion (2537) may be disposed at an end portion of the base layer (2531, 2531'). To describe more particularly, the copper portion (2537) may be disposed at a first surface (2532) of the base layer (2531) of the first FPCB (2530), a second surface (2533') of the second FPCB (2530') facing the first surface (2532), and a third surface (2534, 2534') connecting a lateral portion extended from the first surface (2532) and a lateral portion extended from the second surface (2533'). The copper portion (2537) may not be installed at each of the first to third surfaces (2532, 2533', 2534, 2534') by being divided, but may be formed by being extended on the first to third surfaces (2532, 2533', 2534, 2534'). In addition, a part (an end portion) of the copper portion (2537) may be disposed between the base layer (2531) and the cover layer (2536). In other words, the cover layer (2536, 2536') may cover an end portion of the copper portion (2537).

The copper portion (2537) may also be formed of a conductive material such as copper, like the material of the circuit layer (2535, 2535'). Here, in a case the circuit layer (2535, 2535') formed on the first surface (2532) and the second surface (2533') is connected to the copper portion (2537), the copper portion (2537) may electrically connect the circuit layers (2535, 2535') printed on surfaces of the first FPCB (2530) and the second FPCB (2530') with each other, just like the via hole may do.

Although it is illustrated in FIG. 13 that the copper portion (2537) is separated from the circuit layer (2535, 2535') via the separating portion (2539, 2539'), it is one of exemplary embodiments. In another exemplary embodiment, the copper portion (2537) may be connected to the circuit layer (2535, 2535'). The copper portion (2537) of the FPCB (2520) may be soldered to the coil unit (2510), such that the FPCB (2520) and the coil unit (2510) can be coupled to each other. Thereby, the current flowing in the circuit layer (2535, 2535') of the FPCB (2520) may be transferred to the coil unit (2510). Therefore, the housing (2400) may be moved horizontally relative to the optical axis by Fleming's left hand rule through mutual electromagnetic interaction between the magnet (2300) and the coil unit (2510), when the current is supplied to the coil unit (2510).

Since the cover layer (2536, 2536') may not only cover the circuit layer (2535, 2535'), but also may cover and support an end portion of the copper portion (2537). Thereby, the FCPB (2520) can be prevented from being cracked even when an impact such as dropping is applied to the lens driving device according to an exemplary embodiment. Therefore, the defect rate of the product can be reduced as well.

In the above, all elements composing an exemplary embodiment of the present disclosure have been described as being integrally combined or operating in combination, however, the present disclosure is not limited hereto. That is, within the scope of purpose of the present disclosure, at least one of all such elements may be selectively combined to operate. In addition, the terms such as "include", "comprise" or "have" are state that there may be in existence of features, numbers, steps, functions, elements, components described herein, or compositions thereof. Therefore, they shall not be understood as to exclude the possibility of existence or addition of one or more other features, numbers, steps, functions, elements, components described herein, or compositions thereof.

Unless otherwise defined, all terms used herein, including technical or scientific terms, have the same meanings as those generally understood by those with ordinary knowledge in the field of art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present specification. In the above, exemplary embodiments of the present disclosure have been described. However, these embodiments are merely examples and do not limit the present invention, so that persons who skilled in the art of the present disclosure may easily transform and modify within the limit of the technical spirit of the present disclosure. For example, each of the components shown in detail in the embodiments of the present invention may be implemented in transformation. In addition, the differences relating these transformations and modifications shall be regarded to be included in the scope of the present disclosure as defined in the attached claims of the present disclosure and the equivalents thereof.

What is claimed is:

1. A lens driving device, comprising:
a housing;
a bobbin disposed in the housing;
a base disposed below the housing;
a first coil disposed on the bobbin;
a magnet disposed on the housing and facing the first coil;
a circuit board disposed on the base;
a second coil disposed on the circuit board and facing the magnet; and
a solder electrically connecting the circuit board and the second coil,
wherein the circuit board comprises a body part disposed on an upper surface of the base, a lateral part extending from the body part and disposed on a lateral surface of the base, and a connecting part disposed on an edge portion of the body part and coupled to the solder,
wherein the body part comprises at least one base layer, at least one circuit layer disposed on the at least one base layer and a cover layer disposed on the at least one circuit layer,
wherein an edge portion of the at least one base layer comprises a first surface, a second surface opposite to the first surface, and a third surface connecting the first surface and the second surface,
wherein the connecting part contacts the first surface, the second surface and the third surface of the edge portion of the at least one base layer,
wherein the circuit board comprises a hole disposed at a position corresponding to that of an outer edge of the upper surface of the base,
wherein the connecting part of the circuit board is electrically connected with the second coil by the solder, and
wherein the connecting part comprises a first connecting part disposed on an outer edge portion of the circuit board, and a second connecting part disposed on an inner edge portion of the hole of the circuit board.

2. The lens driving device of claim 1, wherein a portion of the connecting part is disposed between the at least one base layer and the cover layer.

3. The lens driving device of claim 1, wherein the first connecting part comprises four first connecting parts spaced apart from each other,
wherein the second connecting part comprises four second connecting parts spaced apart from each other.

4. The lens driving device of claim 1, wherein the FPCB comprises a groove formed on the outer edge of the FPCB, and
wherein the groove of the FPCB is disposed at a position corresponding to that of the first connecting part.

5. The lens driving device of claim 1, wherein the connecting part is contacted with the cover layer.

6. The lens driving device of claim 1, wherein the connecting part is spaced apart from the at least one circuit layer.

7. The lens driving device of claim 1, wherein a space is formed to be surrounded by the at least one circuit layer, the connecting part, the at least one base layer and the cover layer.

8. The lens driving device of claim 1, wherein the at least one base layer comprises two base layers separately formed and stacked.

9. The lens driving device of claim 1, wherein the connecting part comprises copper.

10. The lens driving device of claim 1, wherein the at least one base layer comprises polyimide.

11. The lens driving device of claim 1, wherein a portion of the connecting part is overlapped with the at least one base layer and the cover layer in a vertical direction.

12. The lens driving device of claim 11, wherein the vertical direction is parallel to an optical axis.

13. A camera module, comprising:
a printed circuit board (PCB);
an image sensor disposed on the PCB;
the lens driving device of claim 1; and
a lens coupled to the bobbin of the lens driving device and disposed at a position corresponding to the image sensor, wherein the circuit board comprises an extending part downwardly extending from the body part and comprising a plurality of terminals coupled to the PCB.

14. An optical apparatus, comprising the camera module of claim 13.

15. The lens driving device of claim 1, wherein the at least one circuit layer comprises a first circuit layer disposed on an upper surface of the at least one base layer and a second circuit layer disposed on a lower surface of the at least one base layer, and
wherein the cover layer comprises a first cover layer disposed on an upper surface of the first circuit layer and a second cover layer disposed on a lower surface of the second circuit layer.

16. The lens driving device of claim 15, wherein the connecting part comprises a first part disposed on the first surface of the at least one base layer, a second part disposed on the second surface of the at least one base layer, and a third part connecting the first part and the second part of the connecting part,
wherein at least a portion of the first part of the connecting part is disposed between the at least one base layer and the first cover layer, and
wherein at least a portion of the second part of the connecting part is disposed between the at least one base layer and the second cover layer.

17. The lens driving device of claim 16, wherein the first part of the connecting part comprises a surface contacted with the first cover layer, and
wherein the second part of the connecting part comprises a surface contacted with the second cover layer.

18. A lens driving device, comprising:
a housing;
a bobbin disposed in the housing;
a base disposed below the housing;
a first coil disposed on the bobbin;
a magnet disposed on the housing and facing the first coil;
a FPCB disposed on the base;
a second coil disposed on the FPCB and facing the magnet; and
a solder electrically connecting the FPCB and the second coil,
wherein the FPCB comprises a body part disposed on an upper surface of the base, a lateral part extending from the body part and disposed on a lateral surface of the base, and a connecting part formed of a conductive material and coupled with the solder,
wherein the FPCB comprises a hole disposed at a position corresponding to that of an outer edge of the upper surface of the base,
wherein the connecting part of the circuit board is electrically connected with the second coil by the solder, and
wherein the connecting part comprises a first connecting part disposed on an outer edge of the body part of the FPCB, and a second connecting part disposed on an inner edge of the hole of the FPCB.

19. The lens driving device of claim 18, wherein the body part of the FPCB comprises a base layer, a circuit layer disposed on the base layer, and a cover layer disposed on the circuit layer,
wherein an edge of the base layer comprises a first surface, a second surface opposite to the first surface, and a third surface connecting the first surface and the second surface, and
wherein the connecting part contacts the first surface, the second surface, and the third surface of the edge of the base layer.

20. The lens driving device of claim 18, wherein the first connecting part comprises four first connecting parts spaced apart from each other,
wherein the second connecting part comprises four second connecting parts spaced apart from each other,
wherein the FPCB comprises a groove formed on the outer edge of the FPCB, and
wherein the groove of the FPCB is disposed at a position corresponding to that of the first connecting part.

* * * * *